(12) United States Patent
Shiramatsu

(10) Patent No.: US 8,773,075 B2
(45) Date of Patent: Jul. 8, 2014

(54) BATTERY MONITORING CIRCUIT AND BATTERY MONITORING SYSTEM

(75) Inventor: Toshio Shiramatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 13/231,644

(22) Filed: Sep. 13, 2011

(65) Prior Publication Data

US 2012/0229094 A1 Sep. 13, 2012

(30) Foreign Application Priority Data

Mar. 11, 2011 (JP) ................................. 2011-054216

(51) Int. Cl.
*H02J 7/00* (2006.01)

(52) U.S. Cl.
USPC ............ 320/136; 320/116; 320/120; 320/134

(58) Field of Classification Search
USPC .................. 320/136, 134, 116, 120
See application file for complete search history.

(56) References Cited

U.S. PATENT DOCUMENTS

| | | | |
|---|---|---|---|
| 4,529,965 A * | 7/1985 | Lee ................................ | 341/122 |
| 6,340,889 B1 * | 1/2002 | Sakurai ........................ | 324/433 |
| 7,535,199 B2 * | 5/2009 | Kimura et al. ................ | 320/121 |
| 7,583,057 B2 * | 9/2009 | Morita .......................... | 320/118 |
| 8,054,044 B2 * | 11/2011 | Kang et al. .................... | 320/118 |
| 8,212,523 B2 * | 7/2012 | Tatebayashi et al. ......... | 320/118 |
| 2003/0222806 A1 * | 12/2003 | Ito et al. ........................ | 341/156 |
| 2009/0068976 A1 * | 3/2009 | Sano et al. .................... | 455/333 |
| 2009/0102421 A1 * | 4/2009 | Imai .............................. | 320/118 |
| 2010/0295379 A1 * | 11/2010 | Garcia .......................... | 307/109 |
| 2012/0182019 A1 * | 7/2012 | Nakagawara ................. | 324/426 |

FOREIGN PATENT DOCUMENTS

| | | |
|---|---|---|
| JP | 2002-156392 | 5/2002 |
| JP | 2007-298426 | 11/2007 |
| JP | 2009-069056 | 4/2009 |

* cited by examiner

*Primary Examiner* — M'Baye Diao
(74) *Attorney, Agent, or Firm* — White & Case LLP

(57) ABSTRACT

The battery monitoring circuit includes a first switch element, a second switch element, a third switch element. The battery monitoring circuit includes a first output capacitor connected to the second end of the first switch element at a first end. The battery monitoring circuit includes a first output controlling switch element connected between a second end of the first output capacitor and the ground. The battery monitoring circuit includes an AD converter that analog-to-digital converts a signal responsive to a voltage at an output terminal between the second end of the first output capacitor and the first output controlling switch element. The battery monitoring circuit includes a controlling circuit that controls turning the first to third switch elements and the first output controlling switch element and controls the AD converter.

20 Claims, 8 Drawing Sheets

BATTERY MONITORING CIRCUIT AND BATTERY MONITORING SYSTEM

CROSS-REFERENCE TO RELATED APPLICATION

This application is based upon and claims the benefit of priority from the prior Japanese Patent Application No. 2011-054216, filed on Mar. 11, 2011, the entire contents of which are incorporated herein by reference.

BACKGROUND

1. Field

Embodiments described herein relate generally to a battery monitoring circuit and a battery monitoring system.

2. Background Art

A battery monitoring circuit that detects abnormality of each voltage of plural secondary cells that are used for batteries of hybrid cars and electric vehicles (EVs) and are connected in series is known.

For example, the battery monitoring circuit according to the related art is configured by using two sets of switch groups to select voltages of terminals between cells and connecting one of the switch groups to one end of a capacitor and connecting the other switch group to the other end of the capacitor.

According to the operation of the battery monitoring circuit according to the related art, first, upper and lower terminals of target cells are connected to both ends of the capacitor to equalize a voltage between the terminals of the capacitor to a cell voltage. Next, after the capacitor and the two switch groups are disconnected and both ends of the capacitor are opened, using a set of switches to be separately prepared, one end of the capacitor is connected to a reference voltage of an A/D converter and the other end of the capacitor is connected to an input of the A/D converter, and the cell voltage is measured.

By sequentially performing a series of operations of the battery monitoring circuit according to the related art on the target cells, voltages of all of the cells can be measured.

However, in the battery monitoring circuit according to the related art, the two sets of switch groups need to be provided to select the voltages of the terminals between the cells and a circuit scale increases. Further, one set of switches need to be provided between the capacitor and the A/D converter.

That is, a manufacturing cost of the battery monitoring circuit increases.

DETAILED DESCRIPTION

A battery monitoring circuit according to an embodiment, monitors voltages of a plurality of secondary batteries connected in series with each other. The battery monitoring circuit includes a first switch element connected to a first terminal at a first end, the first terminal being intended to be connected to a positive pole of a first secondary battery. The battery monitoring circuit includes a second switch element connected to a second terminal at a first end and to a second end of the first switch element at a second end, the second terminal being intended to be connected to a negative pole of the first secondary battery and a positive pole of a second secondary battery. The battery monitoring circuit includes a third switch element connected to a third terminal at a first end and to the second end of the first switch element at a second end, the third terminal being connected to the ground and intended to be connected to a negative pole of the second secondary battery. The battery monitoring circuit includes a first output capacitor connected to the second end of the first switch element at a first end. The battery monitoring circuit includes a first output controlling switch element connected between a second end of the first output capacitor and the ground. The battery monitoring circuit includes an AD converter that analog-to-digital converts a signal responsive to a voltage at an output terminal between the second end of the first output capacitor and the first output controlling switch element and outputs the resulting digital signal. The battery monitoring circuit includes a controlling circuit that controls turning on and off of the first to third switch elements and the first output controlling switch element and controls operation of the AD converter.

DETAILED DESCRIPTION OF THE INVENTION

In the following, embodiments will be described with reference to the drawings.

COMPARATIVE EXAMPLES

First, comparative examples of a battery monitoring circuit will be described.

Figure 6:
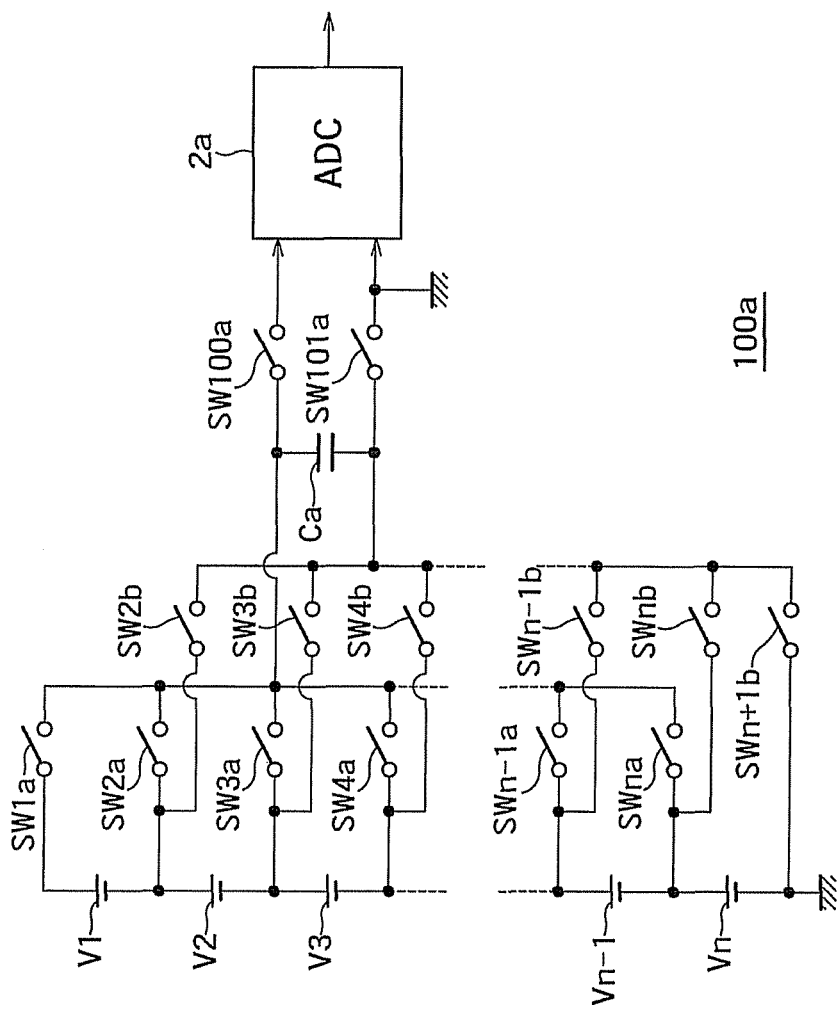
FIG. 6 is a diagram showing a configuration of a battery monitoring circuit 100a according to a comparative example.

FIG. 6 is a diagram showing a configuration of a battery monitoring circuit 100a according to a comparative example.

As shown in FIG. 6, the battery monitoring circuit includes n secondary batteries V1 to Vn, switch elements SW1a to SWna, SW1b to SWnb, SW100a and SW101a, a capacitor Ca, and an AD converter 2a. The battery monitoring circuit 100a detects and monitors voltage by inputting the voltage of each secondary battery V1 to Vn to the AD converter 2a, which converts the voltage.

An exemplary operation of the battery monitoring circuit 100a according to the comparative example shown in FIG. 6 will be described.

First, the voltage of the secondary battery V1 is measured. More specifically, the switch elements SW1a and SW2b are turned on, and all the other switch elements are turned off, thereby accumulating the voltage of the secondary battery V1 in the capacitor Ca.

Next, all the switch elements are once turned off, and then, the switch elements SW100a and SW101a are turned on. This operation allows the voltage of the secondary battery V1 with reference to the ground to be input to the AD converter 2a.

The series of operations described above is performed for all the secondary batteries. This type of operation of the battery monitoring circuit is referred to as a flying capacitor type.

The configuration of the battery monitoring circuit according to this comparative example requires many switch elements (as many as twice the number of secondary batteries plus three) and thus is complicated and difficult to build at low cost.

Figure 7:
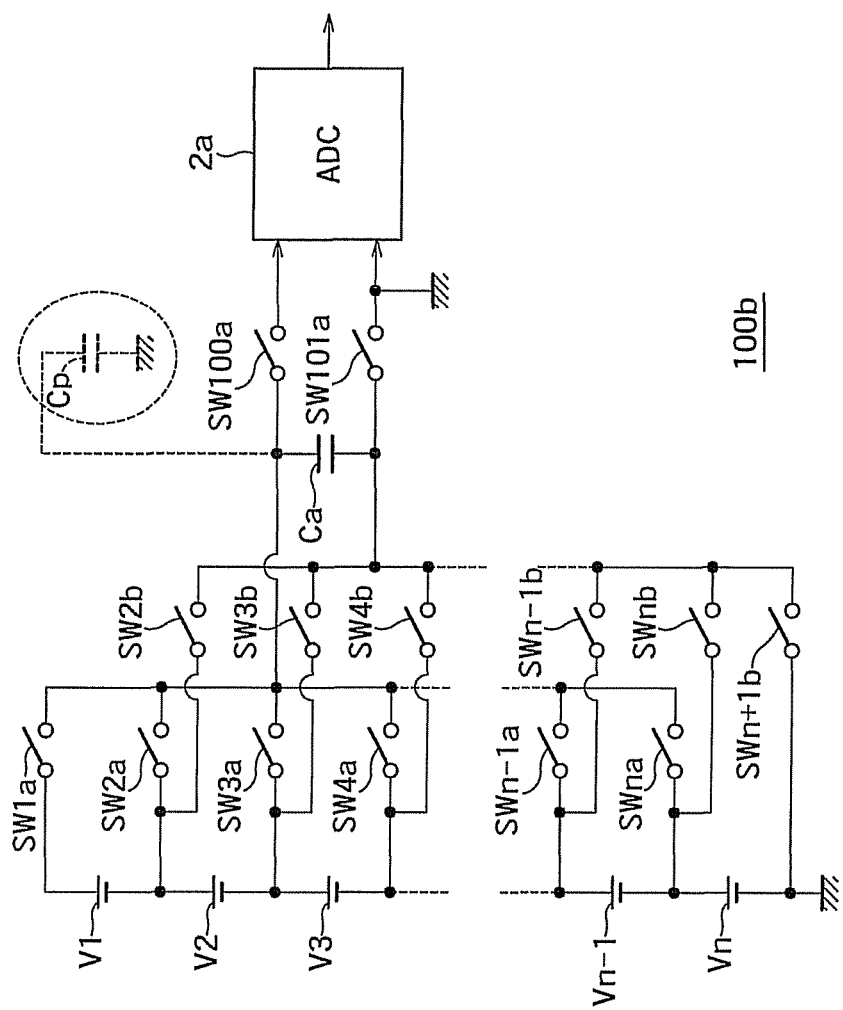
FIG. 7 is a diagram showing a configuration of a battery monitoring circuit 100b according to a comparative example.

FIG. 7 is a diagram showing a configuration of a battery monitoring circuit 100b according to a comparative example.

Figure 8:
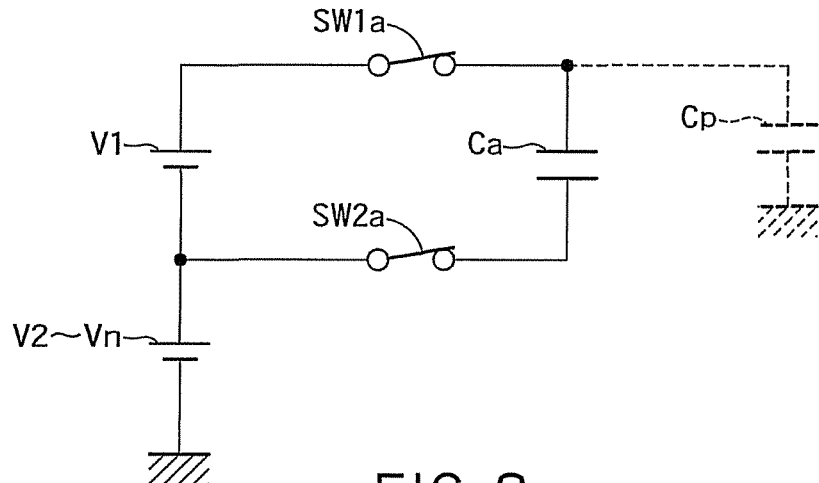
FIG. 8 is a diagram showing an exemplary model for illustrating the effect of the parasitic capacitance Cp of the battery monitoring circuit 100b shown in FIG. 7.
Figure 9:
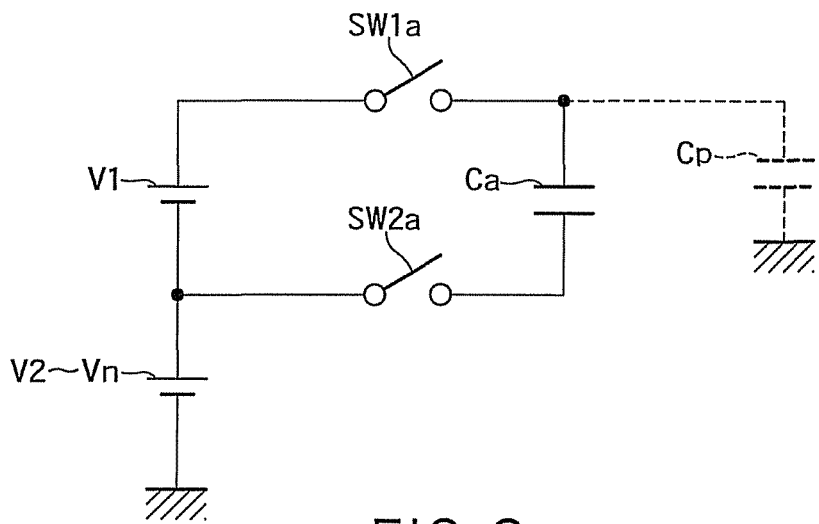
FIG. 9 is a diagram showing an exemplary model for illustrating the effect of the parasitic capacitance Cp of the battery monitoring circuit 100b shown in FIG. 7.
Figure 10:
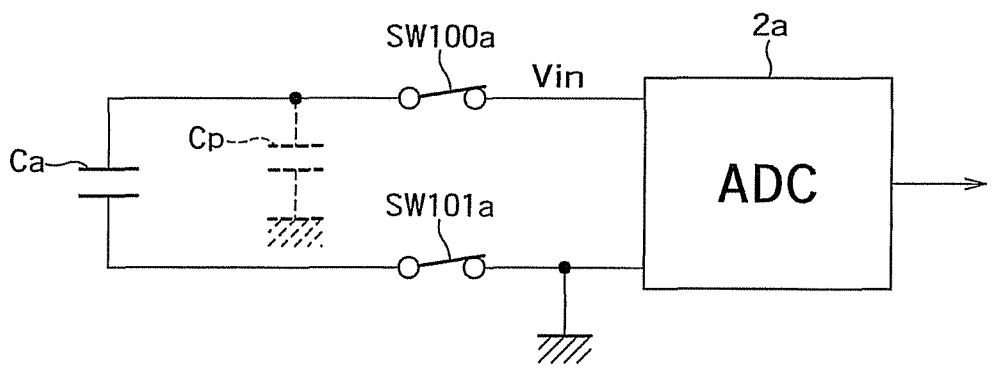
FIG. 10 is a diagram showing an exemplary model for illustrating the effect of the parasitic capacitance Cp of the battery monitoring circuit 100b shown in FIG. 7.

The battery monitoring circuit 100b according to this comparative example shown in FIG. 7 is the same as the battery monitoring circuit 100a shown in FIG. 6 except that a parasitic capacitance Cp is added to the switch elements. The effect of the parasitic capacitance Cp will be described with reference to FIGS. 8 to 10. FIGS. 8 to 10 are diagrams showing an exemplary model for illustrating the effect of the parasitic capacitance Cp of the battery monitoring circuit 100b shown in FIG. 7.

First, as shown in FIG. 8, voltage is accumulated in the capacitor Ca through the operations described above. In this case, charges QCa and QCp accumulated in the capacitor Ca and the parasitic capacitance Cp are expressed by the following formulas (1) and (2).

$$Q_{Ca} = V1 \cdot Ca \quad (1)$$

$$Q_{Cp} = \Sigma Vn \cdot Cp \quad (2)$$

Note that, in this case, the capacitor Ca is charged with the voltage V1, and the parasitic capacitance Cp is charged with the sum of the voltages V1 to Vn.

Then, the closed switch elements SW1a and SW2a are once opened as shown in FIG. 9, and then, the lower terminal of the capacitor Ca is grounded via the switch element 101a as shown in FIG. 10.

The voltage Vin input to the capacitor Ca by this operation is expressed by the following formula (3).

$$Vin = \left(\frac{Q_{Ca} + Q_{Cp}}{Ca + Cp}\right) \quad (3)$$

The difference ΔV between the voltage Vin and the previously charged voltage V1 of the capacitor Ca is expressed by the following formula (4).

$$\Delta V = Vin - V1 \quad (4)$$

$$= \left(\frac{Q_{Ca} + Q_{Cp}}{Ca + Cp}\right) - V1$$

$$= \left(\frac{V1 \cdot Ca + \sum Vn \cdot Cp}{Ca + Cp}\right) - \left(\frac{V1 \cdot Ca + V1 \cdot Cp}{Ca + Cp}\right)$$

$$= \left(\frac{\left(\sum Vn - V1\right) \cdot Cp}{Ca + Cp}\right)$$

As shown by the formula (4), as the total voltage of the secondary batteries increases, the battery monitoring circuit 100b is more susceptible to the effect of the parasitic capacitance Cp, and the error increases. This also means that the voltage of the secondary battery V1 at the highest potential and the voltage of the secondary battery Vn at the lowest potential are measured with different errors.

Thus, embodiments are intended to propose battery monitoring circuits that can measure the voltages of the secondary batteries connected in series with each other with higher accuracy and allow reduction of the circuit footprint.

In the following, embodiments will be described with reference to the drawings.

Embodiment 1

Figure 1:
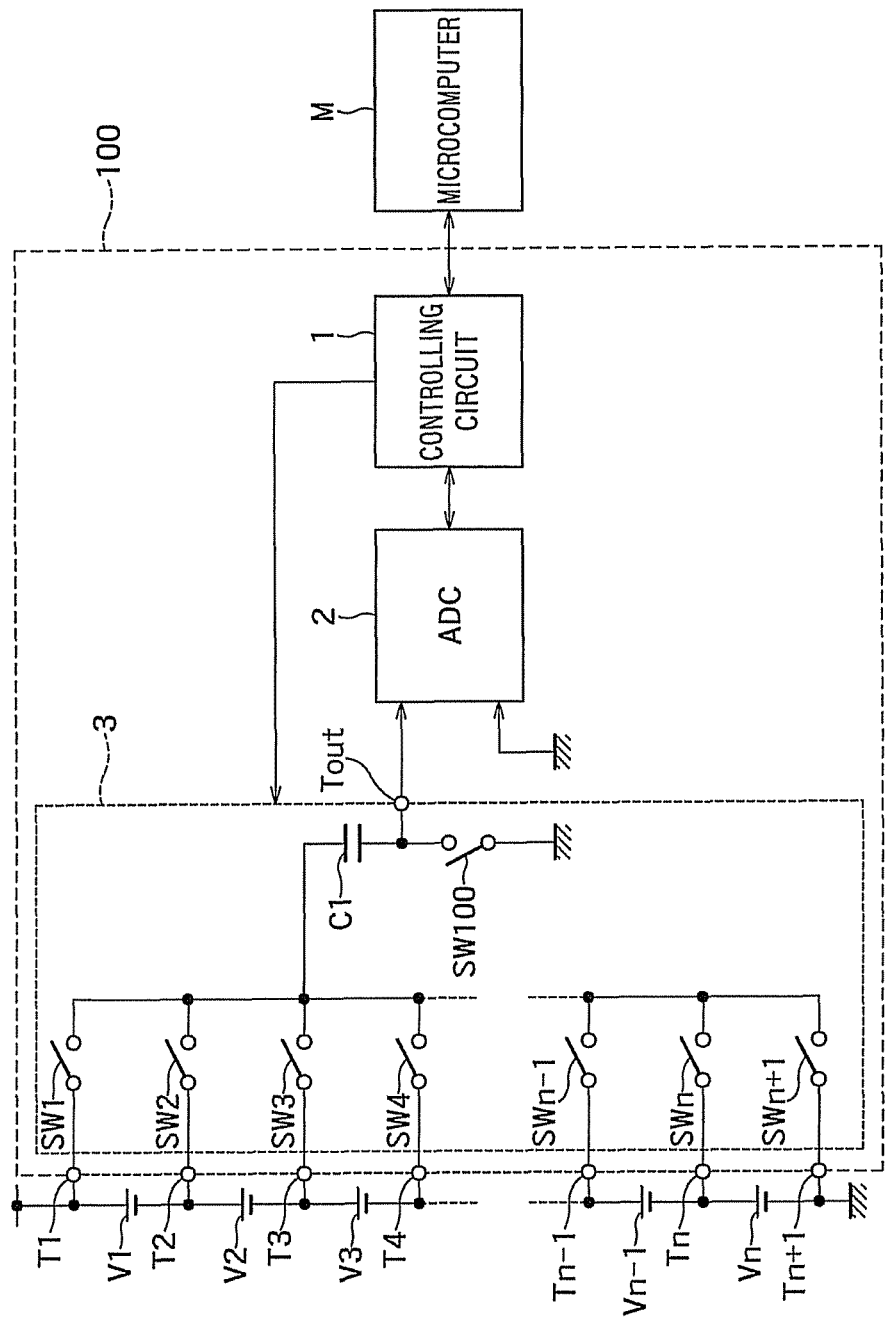
FIG. 1 is a diagram showing an exemplary configuration of a battery monitoring system 1000 according to an embodiment 1.

FIG. 1 is a diagram showing an exemplary configuration of a battery monitoring system 1000 according to an embodiment 1.

As shown in FIG. 1, the battery monitoring system 1000 includes a plurality of (n, (n≥2)) first to nth secondary batteries V1 to Vn connected in series with each other, a battery monitoring circuit 100 that monitors the voltages of the secondary batteries V1 to Vn, and a microcomputer M that controls the battery monitoring circuit 100 based on the measured voltages of the first to n-th secondary batteries V1 to Vn.

The battery monitoring system 1000 is designed to monitor the voltages of the plurality of secondary batteries connected in series with each other.

The first to n-th secondary batteries V1 to Vn are connected in series between a first potential line (a power supply) and a second potential line (ground). The first to n-th secondary batteries are connected to first to n-th terminals T1 to Tn at their respective positive poles, and to second to (n+1)-th terminals T2 to Tn+1 at their respective negative poles. The first to n-th secondary batteries V1 to Vn are lithium ion secondary batteries, for example.

The microcomputer M is designed to control other circuits or the like than the battery monitoring circuit 100 (an electrical system of an automobile, for example).

As shown in FIG. 1, the battery monitoring circuit 100 includes a controlling circuit 1, an AD converter 2, first to (n+1)-th switch elements SW1 to SWn+1, a first output capacitor C1 and a first output controlling switch element SW100.

The first to (n+1)-th switch elements SW1 to SWn+1, the first output capacitor C1 and the first output controlling switch element SW100 constitute a voltage detecting circuit 3.

The first switch element SW1 is connected to the first terminal T1 at one end, the first terminal T1 being connected to the power supply (first potential line) and intended to be connected to the positive pole of the first secondary battery V1.

The second switch element SW2 is connected to the second terminal T2 at one end and to the other end of the first switch element SW1 at the other end, the second terminal T2 being intended to be connected to the negative pole of the first secondary battery V1 and to the positive pole of the second secondary battery V2.

The third switch element SW3 is connected to the third terminal T3 at one end and to the other end of the first switch element SW1 at the other end, the third terminal T3 being grounded (via the third to n-th secondary batteries V3 to Vn) and intended to be connected to the negative pole of the second secondary battery V2.

The other switch elements SW4 to SWn+1 are connected in the same way.

As can be seen from the above description, the battery monitoring circuit 100 can support an increased number of secondary batteries connected in series with each other only by increasing the number of switch elements to select from among the voltages across the terminals of the secondary batteries by the number of the added secondary batteries. Therefore, the battery monitoring circuit 100 can be reduced in circuit footprint compared with the battery monitoring circuit according to the comparative examples.

Furthermore, as shown in FIG. 1, the first output capacitor C1 is connected to the other end of the first switch element SW1 at one end.

The first output controlling switch element SW100 is connected between the other end of the first output capacitor C1 and ground.

An output terminal Tout for outputting an output voltage is connected between the other end of the first output capacitor C1 and the first output controlling switch element S100.

The AD converter 2 analog-to-digital converts a signal (the output voltage at the output terminal Tout in this example) corresponding to the voltage at the output terminal Tout between the other end of the first output capacitor C1 and the first output controlling switch element SW100 and outputs the resulting digital signal.

The controlling circuit 1 controls turning on and off of the first switch element SW1 to the (n+1)-th switch element SWn+1 and the first output controlling switch element SW100 and operation of the AD converter 2.

Note that a discharging switch element (not shown) and a discharging resistor (not shown) are connected in series with each other between every pair of adjacent terminals (between the first terminal T1 and the second terminal T2, for example). The discharging switch element is turned on and off under the control of the controlling circuit 1.

In response to the digital signal output from the AD converter 2, the controlling circuit 1 acquires (detects) the voltages of the first to n-th secondary batteries V1 to Vn and controls the discharging switch elements.

For example, based on the digital signal, the controlling circuit 1 acquires the voltage of the first secondary battery V1. Then, for example, the controlling circuit 1 compares the voltage of the first secondary battery V1 with a preset threshold voltage. If the controlling circuit 1 determines that the voltage of the first secondary battery V1 is higher than the threshold voltage, the controlling circuit 1 lowers the voltage of the first secondary battery V1 (makes the first secondary battery V1 discharge).

More specifically, to lower the voltage of the first secondary battery V1, for example, the controlling circuit 1 turns on the discharging switch element connected between the first terminal T1 and the second terminal T2. This operation causes a current to flow to the discharging resistor connected in series with the discharging switch element, the discharging resistor consumes the energy of the first secondary battery V1, and thus, the voltage of the first secondary battery V1 lowers.

As described above, based on the detected voltage, the battery monitoring system 1000 makes any secondary battery with a voltage higher than a prescribed level discharge, thereby adjusting the voltage of each secondary battery to be equal to or lower than the prescribed level.

Thus, in the case where the secondary batteries are lithium ion secondary batteries, for example, the lifetime of the secondary batteries can be prevented from being shortened because of overcharge or the like.

Note that the first to (n+1)-th switch elements SW1 to SWn+1, the first output controlling switch SW100 and the discharging switch elements are formed by a MOS transistor, for example. In that case, the controlling circuit 1 controls the gate voltage of the MOS transistor forming each switch element to control turning on and off of the switch element.

Next, an exemplary operation of the battery monitoring circuit 100 configured as described above will be described.

First, to measure the voltage of the first secondary battery V1, the controlling circuit 1 turns on the second switch element SW2 and the first output controlling switch element SW100 and turns off the first switch element SW1 and the third to n-th switch elements SW3 to SWn.

By this operation, the first output capacitor C1 is charged according to the potential difference between the second terminal T2 (the positive pole of the second secondary battery V2) and the ground. Specifically, the voltage at one end of the first output capacitor C1 is the sum of the voltages of the second to n-th secondary batteries V2 to Vn, and the voltage at the other end of the first output capacitor C1 (i.e., at the output terminal Tout) is the ground voltage.

Then, the controlling circuit 1 turns off all the switch elements, that is, the first to n-th switch elements SW1 to SWn and the first output controlling switch element SW100.

Then, the controlling circuit 1 turns on the first switch element SW1. As a result of this operation, the voltage at the one end of the first output capacitor C1 changes to the sum of the voltages of the first to n-th secondary batteries V1 to Vn, and the voltage at the other end of the first output capacitor C1 (i.e., at the output terminal Tout) changes to the voltage of the first secondary battery V1.

In the case of measuring the voltage of the first secondary battery V1, the controlling circuit 1 makes the AD converter 2 digital-to-analog convert the output voltage at the output terminal Tout when the first switch element SW1 is turned on, that is, when the voltage at the other end of the first output capacitor C1 (i.e., at the output terminal Tout) becomes equal to the voltage of the first secondary battery V1.

This operation allows the controlling circuit 1 to detect the voltage of the first secondary battery V1 based on the digital signal output from the AD converter 2.

To measure the voltage of the second secondary battery V2, the controlling circuit 1 turns on the third switch element SW3 and the first output controlling switch element SW100 and turns off the first switch element SW1, the second switch element SW2 and the fourth to n-th switch elements SW4 to SWn.

By this operation, the first output capacitor C1 is charged according to the potential difference between the third terminal T3 (the positive pole of the third secondary battery V3) and the ground. Specifically, the voltage at one end of the first output capacitor C1 is the sum of the voltages of the third to n-th secondary batteries V3 to Vn, and the voltage at the other end of the first output capacitor C1 (i.e., at the output terminal Tout) is the ground voltage.

Then, the controlling circuit 1 turns off all the switch elements, that is, the first to n-th switch elements SW1 to SWn and the first output controlling switch element SW100.

Then, the controlling circuit 1 turns on the second switch element SW2. As a result of this operation, the voltage at the one end of the first output capacitor C1 changes to the sum of the voltages of the second to n-th secondary batteries V2 to Vn, and the voltage at the other end of the first output capacitor C1 (i.e., at the output terminal Tout) changes to the voltage of the second secondary battery V2.

In the case of measuring the voltage of the second secondary battery V2, the controlling circuit 1 makes the AD converter 2 digital-to-analog convert the output voltage at the output terminal Tout when the second switch element SW2 is turned on, that is, when the voltage at the other end of the first output capacitor C1 (i.e., at the output terminal Tout) becomes equal to the voltage of the second secondary battery V2.

This operation allows the controlling circuit 1 to detect the voltage of the second secondary battery V2 based on the digital signal output from the AD converter 2.

After that, the controlling circuit 1 can repeat the same operations to detect the voltages of the third to n-th secondary batteries V3 to Vn based on the digital signal output from the AD converter 2.

Note that, although the voltages of the secondary batteries are measured beginning with the first secondary battery V1, the voltages may be measured beginning with the n-th secondary battery Vn or in a random order.

Through the operations described above, the battery monitoring circuit 100 can more accurately measure the voltages of the secondary batteries connected in series with each other.

In addition, as described above, the battery monitoring circuit 100 requires a reduced number of switches to select from among the voltages across the terminals of the secondary batteries and therefore can be reduced in circuit size compared with the battery monitoring circuits according to the comparative examples described earlier. In addition, according to this configuration, although a parasitic capacitance appears between the opposite ends of the first output controlling switch element SW100 (between the terminal Tout and the ground), the effect of the parasitic capacitance is smaller than in the comparative examples because the voltage across the first output controlling switch element SW100 is not the sum of the voltages of the secondary batteries but the voltage of one of the secondary batteries.

As described above, the battery monitoring circuit according to this embodiment can more accurately measure the voltage of each of the secondary batteries connected in series with each other and can be reduced in circuit footprint.

Embodiment 2

In an embodiment 2 described below, an exemplary configuration of a battery monitoring circuit that is improved in withstand voltage of an output capacitor compared with the configuration according to the embodiment 1 described above will be described.

Figure 2:
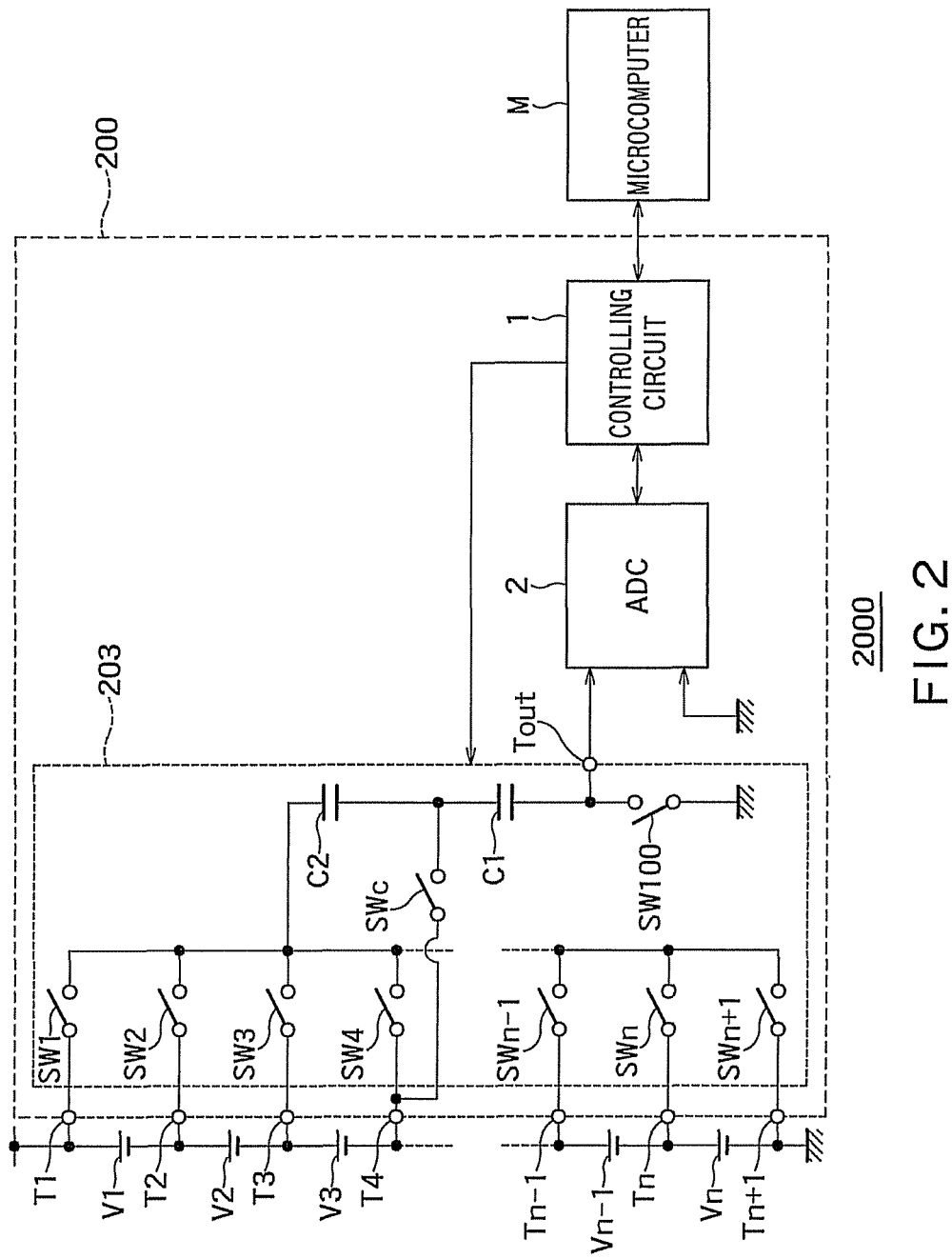
FIG. 2 is a diagram showing an exemplary configuration of a battery monitoring system 2000 according to the embodiment 2.

FIG. 2 is a diagram showing an exemplary configuration of a battery monitoring system 2000 according to the embodiment 2. In FIG. 2, the same reference numerals as those in FIG. 1 denote the same parts as those in the embodiment 1.

As shown in FIG. 2, the battery monitoring system 2000 includes a plurality of (n, (n≥2)) first to n-th secondary batteries V1 to Vn connected in series with each other, a battery monitoring circuit 200 that monitors the voltages of the secondary batteries V1 to Vn, and a microcomputer M that controls the battery monitoring circuit 200 based on the measured voltages of the first to n-th secondary batteries V1 to Vn.

The battery monitoring system 2000 is designed to monitor the voltages of the plurality of secondary batteries connected in series with each other.

As shown in FIG. 2, the battery monitoring circuit 200 includes a controlling circuit 1, an AD converter 2, first to (n+1)-th switch elements SW1 to SWn+1, a first output capacitor C1, a second output capacitor C2, a first output controlling switch element SW100, and a second output controlling switch element SWc.

That is, compared with the battery monitoring circuit 100 according to the embodiment 1, the battery monitoring circuit 200 is additionally provided with the second output capacitor C2 and the second output controlling switch element SWc.

The first to (n+1)-th switch elements SW1 to SWn+1, the first output capacitor C1, the second output capacitor C2, the first output controlling switch element SW100 and the second output controlling switch element SWc constitute a voltage detecting circuit 203.

The second output capacitor C2 is connected between one end of the first output capacitor C1 and the other end of the first switch element SW1.

The second output controlling switch element SWc is connected between the one end of the first output capacitor C1 and a reference potential. In this embodiment, the second output controlling switch element SWc is connected between the one end of the first output capacitor C1 and a fourth terminal T4. That is, the reference potential is the potential at the fourth terminal T4 (the sum of the voltages of the fourth to n-th secondary batteries V4 to Vn), for example.

Alternatively, the second output controlling switch element SWc may be connected between the one end of the first output capacitor C1 and any of the other terminals T2, T3 and T5 to Tn.

Considering the withstand voltage of the first and second output capacitors C1 and C2, the reference voltage is preferably about a half of the sum of the voltages of the first to n-th secondary batteries V1 to Vn.

The remainder of the configuration of the battery monitoring circuit 200 is the same as the battery monitoring circuit 100 according to the embodiment 1.

Next, an exemplary operation of the battery monitoring circuit 200 configured as described above will be described.

First, to measure the voltage of the first secondary battery V1, the controlling circuit 1 turns on the second switch element SW2 and the first and second output controlling switch elements SW100 and SWc and turns off the first switch element SW1 and the third to n-th switch elements SW3 to SWn.

By this operation, the first output capacitor C1 is charged according to the potential difference between the fourth terminal T4 (the positive pole of the fourth secondary battery V4) and the ground, and the second output capacitor C2 is charged according to the potential difference between the second terminal T2 (the positive pole of the second secondary battery V2) and the ground. Specifically, the voltage at one end of the second output capacitor C2 is the sum of the voltages of the second to n-th secondary batteries V2 to Vn, and the voltage at the other end of the first output capacitor C1 (i.e., at the output terminal Tout) is the ground voltage.

As can be seen from the above description, with the battery monitoring circuit 200, the potential difference across one capacitor can be reduced compared with the embodiment 1, and thus, the withstand voltage of the capacitors can be improved.

Then, the controlling circuit 1 turns off all the switch elements, that is, the first to n-th switch elements SW1 to SWn and the first and second output controlling switch elements SW100 and SWc.

Then, the controlling circuit 1 turns on the first switch element SW1. As a result of this operation, the voltage at the one end of the second output capacitor C2 changes to the sum of the voltages of the first to n-th secondary batteries V1 to Vn, and the voltage at the other end of the first output capacitor C1 (i.e., at the output terminal Tout) changes to the voltage of the first secondary battery V1.

In the case of measuring the voltage of the first secondary battery V1, the controlling circuit 1 makes the AD converter 2 digital-to-analog, convert the output voltage at the output terminal Tout when the first switch element SW1 is turned on, that is, when the voltage at the other end of the first output capacitor C1 (i.e., at the output terminal Tout) becomes equal to the voltage of the first secondary battery V1.

This operation allows the controlling circuit 1 to detect the voltage of the first secondary battery V1 based on the digital signal output from the AD converter 2.

To measure the voltage of the second secondary battery V2, the controlling circuit 1 turns on the third switch element SW3 and the first and second output controlling switch elements SW100 and SWc and turns off the first switch element SW1, the second switch element SW2 and the fourth to n-th switch elements SW4 to SWn.

By this operation, the first output capacitor C1 is charged according to the potential difference between the fourth terminal T4 (the positive pole of the fourth secondary battery V4) and the ground, and the second output capacitor C2 is charged according to the potential difference between the third terminal T3 (the positive pole of the third secondary battery V3) and the ground. Specifically, the voltage at one end of the second output capacitor C2 is the sum of the voltages of the third to n-th secondary batteries V3 to Vn, and the voltage at the other end of the first output capacitor C1 (i.e., at the output terminal Tout) is the ground voltage.

As described above, with the battery monitoring circuit 200, the potential difference across one capacitor can be reduced compared with the embodiment 1, and thus the withstand voltage of the capacitors can be improved.

Then, the controlling circuit 1 turns off all the switch elements, that is, the first to n-th switch elements SW1 to SWn and the first and second output controlling switch elements SW100 and SWc.

Then, the controlling circuit 1 turns on the second switch element SW2. As a result of this operation, the voltage at the one end of the second output capacitor C2 changes to the sum of the voltages of the second to n-th secondary batteries V2 to Vn, and the voltage at the other end of the first output capacitor C1 (i.e., at the output terminal Tout) changes to the voltage of the second secondary battery V2.

In the case of measuring the voltage of the second secondary battery V2, the controlling circuit 1 makes the AD converter 2 digital-to-analog convert the output voltage at the output terminal Tout when the second switch element SW2 is turned on, that is, when the voltage at the other end of the first output capacitor C1 (i.e., at the output terminal Tout) becomes equal to the voltage of the second secondary battery V2.

This operation allows the controlling circuit 1 to detect the voltage of the second secondary battery V2 based on the digital signal output from the AD converter 2.

After that, the controlling circuit 1 can repeat the same operations to detect the voltages of the third to n-th secondary batteries V3 to Vn based on the digital signal output from the AD converter 2.

As with the embodiment 1, the battery monitoring circuit 200 requires a reduced number of switches to select from among the voltages across the terminals of the secondary batteries and therefore can be reduced in circuit size compared with the battery monitoring circuits according to the comparative examples.

As described above, the battery monitoring circuit according to this embodiment can more accurately measure the voltage of each of the secondary batteries connected in series with each other and can be reduced in circuit footprint.

Embodiment 3

In the embodiment 2, an exemplary battery monitoring circuit in which the reference potential is the potential of the secondary batteries connected in series with each other has been described.

In an embodiment 3, an exemplary configuration of a battery monitoring circuit provided with a power supply that generates the reference potential will be described.

Figure 3:
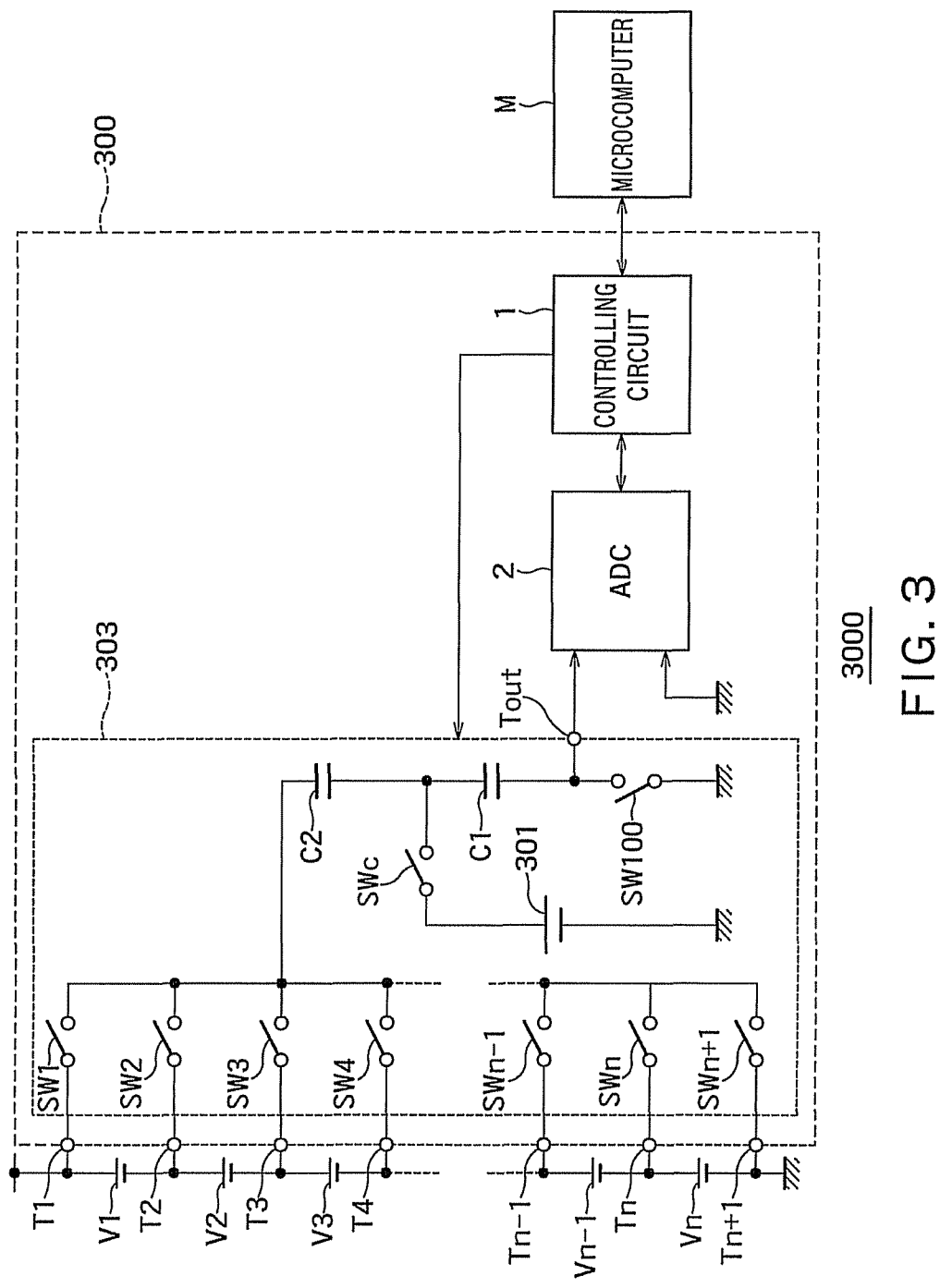
FIG. 3 is a diagram showing an exemplary configuration of a battery monitoring system 3000 according to the embodiment 3.

FIG. 3 is a diagram showing an exemplary configuration of a battery monitoring system 3000 according to the embodiment 3. In FIG. 3, the same reference numerals as those in FIG. 2 denote the same parts as those in the embodiment 2.

As shown in FIG. 3, the battery monitoring system 3000 includes a plurality of (n, (n≥2)) first to n-th secondary batteries V1 to Vn connected in series with each other, a battery monitoring circuit 300 that monitors the voltages of the secondary batteries V1 to Vn, and a microcomputer M that controls the battery monitoring circuit 300 based on the measured voltages of the first to n-th secondary batteries V1 to Vn.

The battery monitoring system 3000 is designed to monitor the voltages of the plurality of secondary batteries connected in series with each other.

As shown in FIG. 3, the battery monitoring circuit 300 includes a controlling circuit 1, an AD converter 2, first to (n+1)-th switch elements SW1 to SWn+1, a first output capacitor C1, a second output capacitor C2, a first output controlling switch element SW100, a second output controlling switch element SWc, and a direct-current power supply 301.

That is, compared with the battery monitoring circuit 200 according to the embodiment 2, the battery monitoring circuit 300 is additionally provided with the direct-current power supply (battery) 301 that outputs the reference voltage.

The first to (n+1)-th switch elements SW1 to SWn+1, the first output capacitor C1, the second output capacitor C2, the first output controlling switch element SW100, the second output controlling switch element SWc and the direct-current power supply 301 constitute a voltage detecting circuit 303.

The remainder of the configuration of the battery monitoring circuit 300 is the same as the battery monitoring circuit 200 according to the embodiment 2.

The operation of the battery monitoring circuit 300 configured as described above is the same as the operation of the battery monitoring circuit 200 according to the embodiment 2. That is, as in the embodiment 2, the controlling circuit 1 can repeat the same series of operations to detect the voltages of the first to n-th secondary batteries V1 to Vn based on the digital signal output from the AD converter 2.

In addition, as with the embodiment 2, the battery monitoring circuit 300 requires a reduced number of switches to select from among the voltages across the terminals of the secondary batteries and therefore can be reduced in circuit size compared with the conventional battery monitoring circuits.

As described above, the battery monitoring circuit according to this embodiment can more accurately measure the voltage of each of the secondary batteries connected in series with each other and can be reduced in circuit footprint.

Embodiment 4

With the configuration according to the embodiment 1 described above, if the voltage of a secondary battery fluctuates or noise occurs after the output capacitor is charged according to the voltage of the secondary battery, the output voltage at the output terminal Tout at the other end of the first output capacitor C1 fluctuates.

Thus, in an embodiment 4, there will be described an exemplary configuration intended for preventing the charge on the output capacitor from fluctuating after the output capacitor is charged according to the voltage of the secondary battery.

Figure 4:
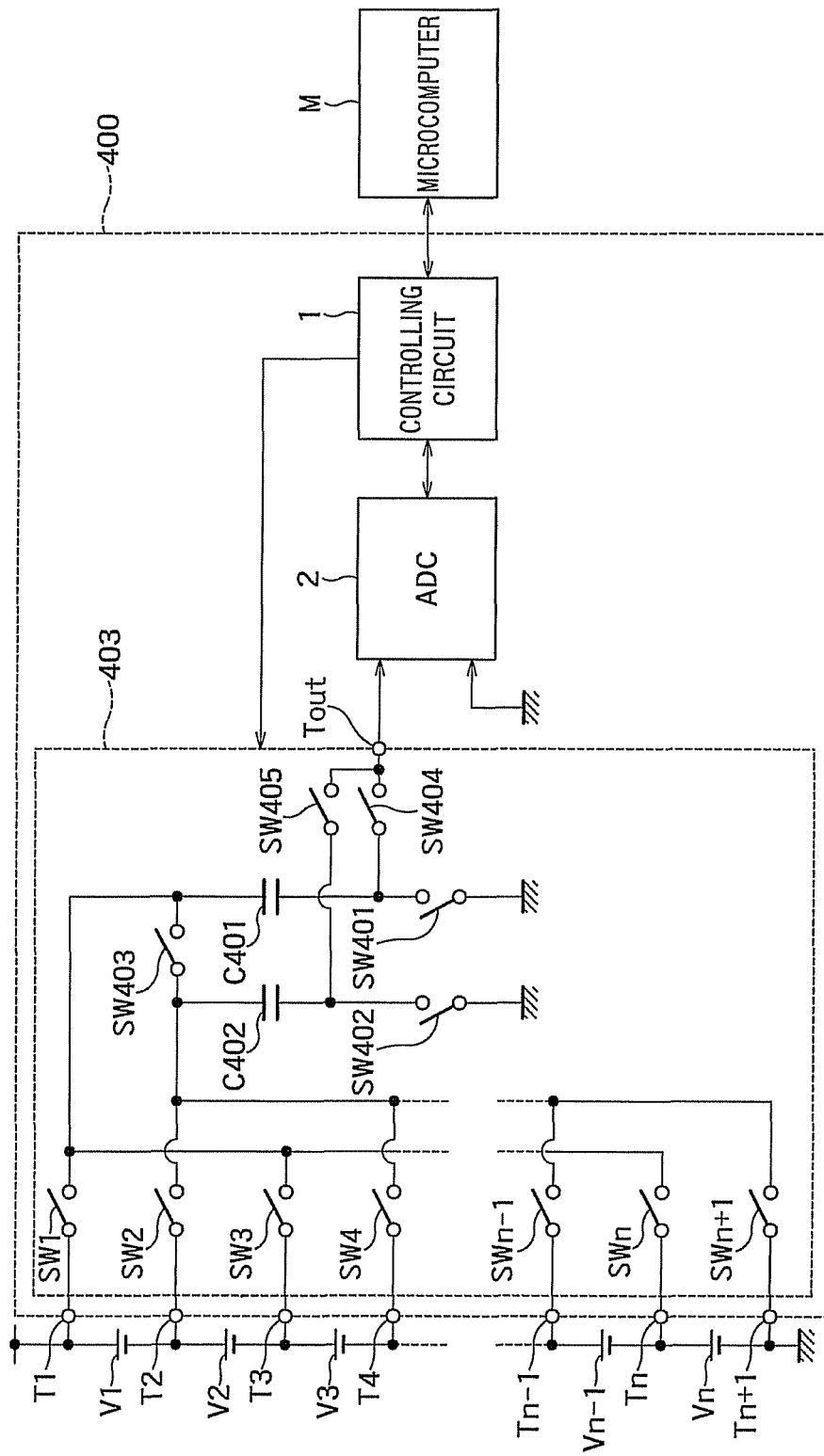
FIG. 4 is a diagram showing an exemplary configuration of a battery monitoring system 4000 according to the embodiment 4.

FIG. 4 is a diagram showing an exemplary configuration of a battery monitoring system 4000 according to the embodiment 4. In FIG. 4, the same reference numerals as those in FIG. 1 denote the same parts as those in the embodiment 1.

As shown in FIG. 4, the battery monitoring system 4000 includes a plurality of (n, (n≥2)) first to n-th secondary batteries V1 to Vn connected in series with each other, a battery monitoring circuit 400 that monitors the voltages of the secondary batteries V1 to Vn, and a microcomputer M that controls the battery monitoring circuit 400 based on the measured voltages of the first to n-th secondary batteries V1 to Vn.

The battery monitoring system 4000 is designed to monitor the voltages of the plurality of secondary batteries connected in series with each other.

As shown in FIG. 4, the battery monitoring circuit 400 includes a controlling circuit 1, an AD converter 2, first to (n+1)-th switch elements SW1 to SWn+1, a first output capacitor C401, a second output capacitor C402, a first output controlling switch element SW401, a second output controlling switch element SW402, a third output controlling switch element SW403, a fourth output controlling switch element SW404, and a fifth output controlling switch element SW405.

The first to (n+1)-th switch elements SW1 to SWn+1, the first output capacitor C401, the second output capacitor C402, the first output controlling switch element SW401, the second output controlling switch element SW402, the third output controlling switch element SW403, the fourth output controlling switch element SW404, and the fifth output controlling switch element SW405 constitute a voltage detecting circuit 403. As described later, the configuration according to this embodiment slightly differs from the configuration according to the embodiment 1 in the way of connection between the first to (n+1)-th switch elements SW1 to SWn+1.

The first switch element SW1 is connected to a first terminal T1 at one end, the first terminal T1 being connected to a power supply (first potential line) and intended to be connected to the positive pole of the first secondary battery V1.

The second switch element SW2 is connected to a second terminal T2 at one end, the second terminal T2 being intended to be connected to the negative pole of the first secondary battery V1 and to the positive pole of the second secondary battery V2.

The third switch element SW3 is connected to a third terminal T3 at one end and to the other end of the first switch element SW1 at the other end, the third terminal T3 being grounded (via the third to n-th secondary batteries V3 to Vn) and intended to be connected to the negative pole of the second secondary battery V2.

The other switch elements SW4 to SWn+1 are connected in the same way.

As can be seen from the above description, the battery monitoring circuit 400 can support an increased number of secondary batteries connected in series with each other only by increasing the number of switch elements to select from among the voltages across the terminals of the secondary batteries by the number of the added secondary batteries. Therefore, the battery monitoring circuit 400 can be reduced in circuit footprint compared with the battery monitoring circuit according to the comparative examples.

Furthermore, as shown in FIG. 4, the first output capacitor C401 is connected to the other end of the first switch element SW1 at one end.

The second output capacitor C402 is connected to the other end of the second switch element SW2 at one end.

The first output controlling switch element SW401 is connected between the other end of the first output capacitor C401 and the ground.

The second output controlling switch element SW402 is connected between the other end of the second output capacitor C402 and the ground.

The third output controlling switch element SW403 is connected between the one end of the first output capacitor C401 and the one end of the second output capacitor C402.

The fourth output controlling switch element SW404 is connected between the other end of the first output capacitor C401 and the output terminal Tout.

The fifth output controlling switch element SW405 is connected between the other end of the second output capacitor C402 and the output terminal Tout.

The AD converter 2 analog-to-digital converts the output voltage at the output terminal Tout and outputs the resulting digital signal.

The controlling circuit 1 controls turning on and off of the first switch element SW1 to the (n+1)-th switch element SWn+1 and the first to fifth output controlling switch elements SW401 to SW405 and operation of the AD converter 2.

Next, an exemplary operation of the battery monitoring circuit 400 configured as described above will be described.

First, to measure the voltage of the first secondary battery V1, the controlling circuit 1 turns on the first and second switch elements SW1 and SW2 and the first, second and fifth output controlling switch elements SW401, SW402 and SW405 and turns off the third to n-th switch elements SW3 to SWn and the third and fourth output controlling switch elements SW403 and SW404.

By this operation, the first output capacitor C401 is charged according to the potential difference between the first terminal T1 (the positive pole of the first secondary battery V1) and the ground, and the second output capacitor C402 is charged according to the potential difference between the second terminal T2 (the positive pole of the second secondary battery V2) and the ground.

Specifically, the voltage at one end of the first output capacitor C401 is the sum of the voltages of the first to n-th secondary batteries V1 to Vn, and the voltage at the other end of the first output capacitor C401 (i.e., at the output terminal Tout) is the ground voltage. The voltage at one end of the second output capacitor C402 is the sum of the voltages of the second to n-th secondary batteries V2 to Vn, and the voltage at the other end of the second output capacitor C2 (i.e., at the output terminal Tout) is the ground voltage.

Then, the controlling circuit 1 turns off the first and second switch elements SW1 and SW2.

Then, the controlling circuit 1 turns off the second output controlling switch element SW402.

Then, the controlling circuit 1 turns on the third output controlling switch element SW403. As a result of this operation, the voltage at the other end of the first output capacitor C401 (i.e., at the output terminal Tout) changes to the voltage of the first secondary battery V1.

In the case of measuring the voltage of the first secondary battery V1, the controlling circuit 1 makes the AD converter 2 digital-to-analog convert the output voltage at the output terminal Tout when the third controlling switch element SW403 is turned on, that is, when the voltage at the output terminal Tout becomes equal to the voltage of the first secondary battery V1.

This operation allows the controlling circuit 1 to detect the voltage of the first secondary battery V1 based on the digital signal output from the AD converter 2.

To measure the voltage of the second secondary battery V2, the controlling circuit 1 turns on the second and third switch elements SW2 and SW3 and the first, second and fourth output controlling switch elements SW401, SW402 and SW404 and turns off the first switch element SW1, the fourth to n-th switch elements SW4 to SWn and the third and fifth output controlling switch elements SW403 and SW405.

By this operation, the first output capacitor C401 is charged according to the potential difference between the third terminal T3 (the positive pole of the third secondary battery V3) and the ground, and the second output capacitor C402 is charged according to the potential difference between the second terminal T2 (the positive pole of the second secondary battery V2) and the ground.

Specifically, the voltage at one end of the first output capacitor C401 is the sum of the voltages of the third to n-th secondary batteries V3 to Vn, and the voltage at the other end of the first output capacitor C401 (i.e., at the output terminal Tout) is the ground voltage. The voltage at one end of the second output capacitor C402 is the sum of the voltages of the second to n-th secondary batteries V2 to Vn, and the voltage at the other end of the second output capacitor C2 (i.e., at the output terminal Tout) is the ground voltage.

Then, the controlling circuit 1 turns off the second and third switch elements SW2 and SW3.

Then, the controlling circuit 1 turns off the first output controlling switch element SW401.

Then, the controlling circuit 1 turns on the third output controlling switch element SW403. As a result of this operation, the voltage at the other end of the second output capacitor C402 (i.e., at the output terminal Tout) changes to the voltage of the second secondary battery V2.

In the case of measuring the voltage of the second secondary battery V2, the controlling circuit 1 makes the AD converter 2 digital-to-analog convert the output voltage at the output terminal Tout when the third controlling switch element SW403 is turned on, that is, when the voltage at the output terminal Tout becomes equal to the voltage of the second secondary battery V2.

This operation allows the controlling circuit 1 to detect the voltage of the second secondary battery V2 based on the digital signal output from the AD converter 2.

After that, the controlling circuit 1 can repeat the same operations to detect the voltages of the third to n-th secondary batteries V3 to Vn based on the digital signal output from the AD converter 2.

Note that, although the voltages of the secondary batteries are measured beginning with the first secondary battery V1, the voltages may be measured beginning with the n-th secondary battery Vn or in a random order.

Through the operations described above, the battery monitoring circuit 400 can more accurately measure the voltages of the secondary batteries connected in series with each other.

In addition, as in the embodiment 1, the battery monitoring circuit 400 requires a reduced number of switches to select from among the voltages across the terminals of the secondary batteries and therefore can be reduced in circuit size compared with the conventional battery monitoring circuits.

As described above, the battery monitoring circuit according to this embodiment can more accurately measure the voltage of each of the secondary batteries connected in series with each other and can be reduced in circuit footprint.

Embodiment 5

In an embodiment 5, an exemplary configuration intended for reducing the effect of the parasitic capacitance will be described.

Figure 5:
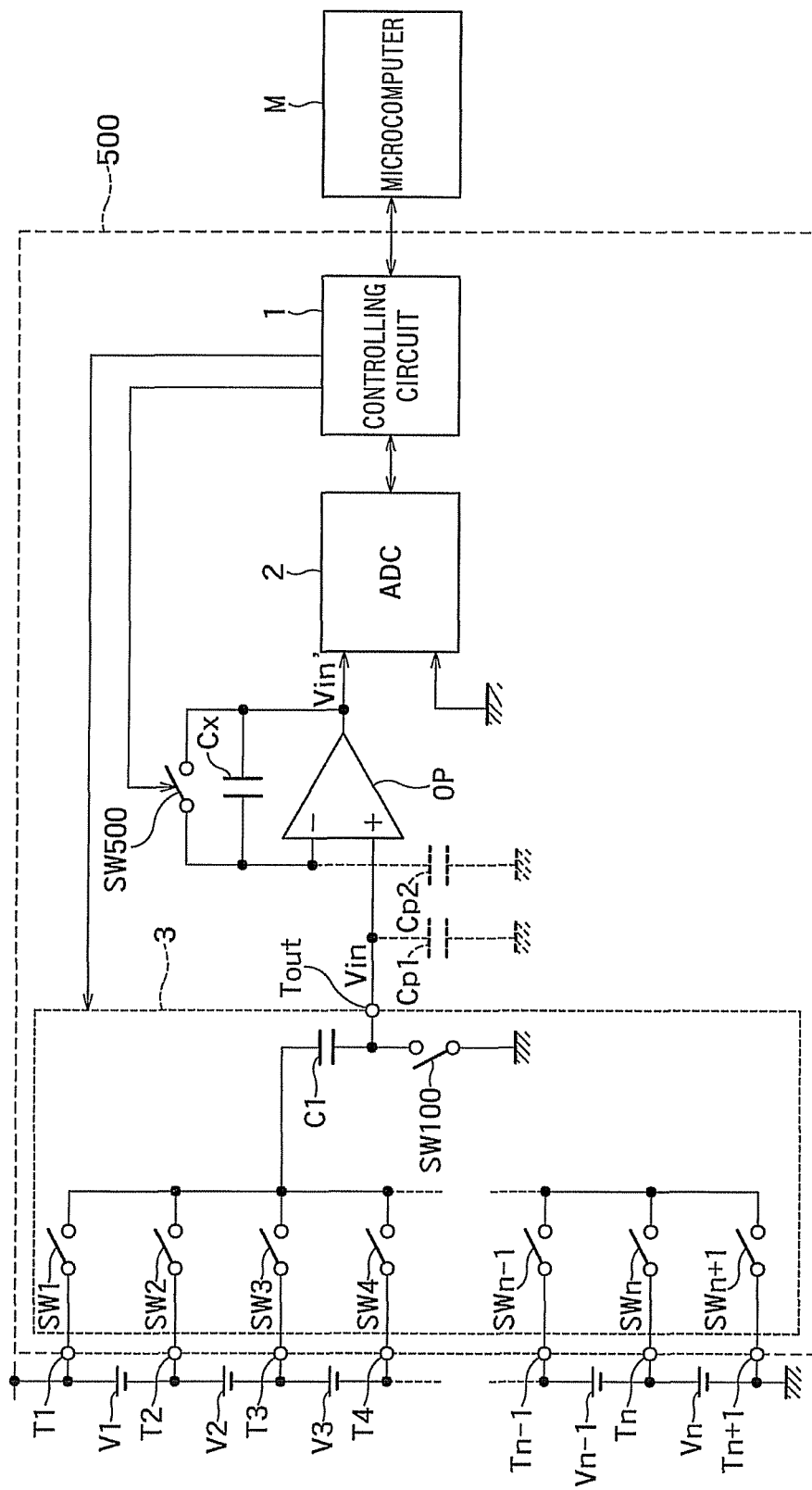
FIG. 5 is a diagram showing an exemplary configuration of a battery monitoring system 5000 according to the embodiment 5.

FIG. 5 is a diagram showing an exemplary configuration of a battery monitoring system 5000 according to the embodiment 5. IN FIG. 5, the same reference numerals as those in FIG. 1 denote the same parts as those in the embodiment 1.

As shown in FIG. 5, the battery monitoring system 5000 includes a plurality of (n, (n≥2)) first to n-th secondary batteries V1 to Vn connected in series with each other, a battery monitoring circuit 500 that monitors the voltages of the secondary batteries V1 to Vn, and a microcomputer M that controls the battery monitoring circuit 500 based on the measured voltages of the first to n-th secondary batteries V1 to Vn.

The battery monitoring system 5000 is designed to monitor the voltages of the plurality of secondary batteries connected in series with each other.

As shown in FIG. 5, the battery monitoring circuit 500 includes a controlling circuit 1, an AD converter 2, first to (n+1)-th switch elements SW1 to SWn+1, a first output capacitor C1, an amplifier capacitor Cx, an operational amplifier OP, a first output controlling switch element SW100, and an amplifier switch element SW500.

That is, compared with the battery monitoring circuit 100, according to the embodiment 1, the battery monitoring circuit 500 is additionally provided with the amplifier capacitor Cx, the operational amplifier OP, and the amplifier switch element SW500.

As shown in FIG. 5, the operational amplifier OP is connected to the output terminal Tout at the non-inverting input terminal thereof.

The amplifier capacitor Cx is connected between the output of the operational amplifier OP and the inverting input terminal of the operational amplifier OP and connected to the input of the AD converter 2 at the output thereof.

The amplifier switch element SW500 is connected between the output and the inverting input terminal of the operational amplifier OP in parallel with the amplifier capacitor Cx. In this embodiment, the AD converter 2 is designed to analog-to-digital convert the output signal of the operational amplifier OP and output the resulting digital signal.

It is assumed that there is a parasitic capacitance Cp1 between the non-inverting input terminal of the operational amplifier OP and the ground, and there is a parasitic capacitance Cp2 between the inverting input terminal of the operational amplifier OP and the ground.

In this case, the voltage Vin at the output terminal Tout when the first secondary battery V1 is selected is expressed by the following formula (5), considering the effect of the parasitic capacitance Cp1. In the formula (5), it is assumed that the voltage of the first secondary battery V1 is denoted by V1, the capacitance of the first output capacitor C1 is denoted by C1, and the capacitance of the parasitic capacitance Cp1 is denoted by Cp1.

$$Vin = V1 \cdot \frac{C1}{C1 + Cp1} \qquad (5)$$

The operation of the battery monitoring circuit 500 is basically the same as the operation of the battery monitoring circuit 100 according to the embodiment 1. The controlling circuit 1 controls the amplifier switch element SW500 to be turned on and off in synchronization with the first output controlling switch element SW100.

Therefore, when the first output controlling switch element SW100 is on, the operational amplifier OP serves as an ordinary buffer amplifier, and the voltage Vin' at the output of the operational amplifier Op is equal to the voltage Vin, i.e., 0V.

On the other hand, when the first output controlling switch element SW100 is off, the amplifier switch element SW500 is also off. At this time, the gain "Gain" of the operational amplifier OP is expressed by the following formula (6).

$$\text{Gain} = \frac{Cx + Cp2}{Cx} \qquad (6)$$

At this time, the voltage Vin' input to the AD converter 2 is expressed by the following formula (7).

$$\begin{aligned}Vin' &= Vin \cdot \text{Gain} \qquad (7) \\ &= V1 \cdot \frac{C1}{C1 + Cp1} \cdot \frac{Cx + Cp2}{Cx}\end{aligned}$$

As can be seen from the formula (7), the voltage Vin becomes equal to the voltage V1 of the first secondary battery V1 if each parameter is set so that C1/(C1+Cp1) is the inverse of (Cx+Cp2)/Cx.

The battery monitoring circuit 500 can reduce the effect of the parasitic capacitances if the capacitance of the first output capacitor C1 is set to be equal to the capacitance of the amplifier capacitor Cx and the first output controlling switch element SW100 and the amplifier switch element SW500 are formed by the same switch elements.

As in the embodiment 1, the battery monitoring circuit 500 requires a reduced number of switches to select from among the voltages across the terminals of the secondary batteries and therefore can be reduced in circuit size compared with the conventional battery monitoring circuits.

Although the embodiment 5 is applied to the configuration according to the embodiment 1 in the example described above, the embodiment 5 can be equally applied to the embodiments 2 to 4.

As described above, the battery monitoring circuit according to this embodiment can more accurately measure the voltage of each of the secondary batteries connected in series with each other and can be reduced in circuit footprint.

In the embodiments described above, it is assumed that the discharging switch elements and the discharging resistor are included in the battery monitoring circuit. However, the discharging switch elements and the discharging resistor may be included in a circuit other than the battery monitoring circuit (an external circuit or the like).

In the embodiments described above, it is assumed that the voltages of the secondary batteries are measured in the order from the secondary battery with the lowest voltage to the secondary battery with the highest voltage. However, the voltages of the secondary batteries may be measured in the reverse order, that is, from the secondary battery with the highest voltage to the secondary battery with the lowest voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A battery monitoring circuit that monitors voltages of n (n≥2) secondary batteries connected in series with each other, comprising:
   a first switch element connected to a first terminal at a first end, the first terminal being intended to be connected to a positive pole of a first secondary battery;
   a second switch element connected to a second terminal at a first end and to a second end of the first switch element at a second end, the second terminal being intended to be connected to a negative pole of the first secondary battery and a positive pole of a second secondary battery;
   a (n+1)-th switch element connected to a (n+1)-th terminal at a first end and to the second end of the first switch element at a second end, the (n+1)-th terminal being connected to a ground and intended to be connected to a negative pole of a n-th secondary battery;
   a first output capacitor connected to the second end of the first switch element at a first end;
   a first output controlling switch element connected between a second end of the first output capacitor and the ground;
   an AD converter that analog-to-digital converts a signal responsive to a voltage at an output terminal between the second end of the first output capacitor and the first output controlling switch element and outputs the resulting digital signal; and
   a controlling circuit that controls turning on and off of the first to (n+1)-th switch elements and the first output controlling switch element and controls operation of the AD converter.

2. The battery monitoring circuit according to claim 1, wherein in a case of measuring a voltage of the first secondary battery, the controlling circuit turns on the second switch element and the first output controlling switch element and turns off the first switch element and the (n+1)-th switch element, then turns off the first to (n+1)-th switch elements and the first output controlling switch element, and then turns on the first switch element.

3. The battery monitoring circuit according to claim 1, wherein in a case of measuring a voltage of the second secondary battery, the controlling circuit turns on the (n+1)-th switch element and the first output controlling switch element and turns off the first switch element and the second switch element, then turns off the first to (n+1)-th switch elements and the first output controlling switch element, and then turns on the second switch element.

4. The battery monitoring circuit according to claim 2, wherein in a case of measuring a voltage of the second secondary battery, the controlling circuit turns on the (n+1)-th switch element and the first output controlling switch element and turns off the first switch element and the second switch element, then turns off the first to (n+1)-th switch elements and the first output controlling switch element, and then turns on the second switch element.

5. The battery monitoring circuit according to claim 1, further comprising:
a second output capacitor connected between the first end of the first output capacitor and the second end of the first switch element; and
a second output controlling switch element connected between a second end of the first output capacitor and a reference potential.

6. The battery monitoring circuit according to claim 5, wherein the reference potential is a potential of the second terminal.

7. The battery monitoring circuit according to claim 5, wherein in a case of measuring a voltage of the first secondary battery, the controlling circuit turns on the second switch element and the first and second output controlling switch elements and turns off the first switch element and the (n+1)-th switch element, then turns off the first to (n+1)-th switch elements and the first and second output controlling switch elements, and then turns on the first switch element.

8. The battery monitoring circuit according to claim 6, wherein in a case of measuring a voltage of the first secondary battery, the controlling circuit turns on the second switch element and the first and second output controlling switch elements and turns off the first switch element and the (n+1)-th switch element, then turns off the first to (n+1)-th switch elements and the first and second output controlling switch elements, and then turns on the first switch element.

9. The battery monitoring circuit according to claim 5, wherein in a case of measuring a voltage of the second secondary battery, the controlling circuit turns on the (n+1)-th switch element and the first and second output controlling switch elements and turns off the first switch element and the second switch element, then turns off the first to (n+1)-th switch elements and the first and second output controlling switch elements, and then turns on the second switch element.

10. The battery monitoring circuit according to claim 6, wherein in a case of measuring a voltage of the second secondary battery, the controlling circuit turns on the (n+1)-th switch element and the first and second output controlling switch elements and turns off the first switch element and the second switch element, then turns off the first to (n+1)-th switch elements and the first and second output controlling switch elements, and then turns on the second switch element.

11. The battery monitoring circuit according to claim 7, wherein in a case of measuring a voltage of the second secondary battery, the controlling circuit turns on the (n+1)-th switch element and the first and second output controlling switch elements and turns off the first switch element and the second switch element, then turns off the first to (n+1)-th switch elements and the first and second output controlling switch elements, and then turns on the second switch element.

12. The battery monitoring circuit according to claim 8, wherein in a case of measuring a voltage of the second secondary battery, the controlling circuit turns on the (n+1)-th switch element and the first and second output controlling switch elements and turns off the first switch element and the second switch element, then turns off the first to (n+1)-th switch elements and the first and second output controlling switch elements, and then turns on the second switch element.

13. A battery monitoring circuit that monitors voltages of n (n≥2) secondary batteries connected in series with each other, comprising:

a first switch element connected to a first terminal at a first end, the first terminal being intended to be connected to a positive pole of a first secondary battery;
a second switch element connected to a second terminal at a first end, the second terminal being intended to be connected to a negative pole of the first secondary battery and a positive pole of a second secondary battery;
a (n+1)-th switch element connected to a (n+1)-th terminal at a first end and to the second end of the first switch element at a second end, the (n+1)-th terminal being connected to a ground and intended to be connected to a negative pole of a n-th secondary battery;
a first output capacitor connected to the second end of the first switch element at a first end;
a second output capacitor connected to the second end of the second switch element at a first end;
a first output controlling switch element connected between a second end of the first output capacitor and the ground;
a second output controlling switch element connected between a second end of the second output capacitor and the ground;
a third output controlling switch element connected between the first end of the first output capacitor and the first end of the second output capacitor;
a fourth output controlling switch element connected between the second end of the first output capacitor and an output terminal;
a fifth output controlling switch element connected between the second end of the second output capacitor and the output terminal;
an AD converter that analog-to-digital converts a signal responsive to a voltage at the output terminal between and outputs the resulting digital signal; and
a controlling circuit that controls turning on and off of the first to (n+1)-th switch elements and the first to fifth output controlling switch element and controls operation of the AD converter.

14. The battery monitoring circuit according to claim 13, wherein in a case of measuring a voltage of the first secondary battery, the controlling circuit turns on the first and second switch element and the first, second and fifth output controlling switch element and turns off the (n+1)-th switch element and the third and fourth output controlling switch element, then turns off the first and second switch elements, then turns off the second output controlling switch element, and then turns on the (n+1)-th switch element.

15. The battery monitoring circuit according to claim 1, further comprising:
an operational amplifier connected to the output terminal at a non-inverting input terminal and to an input of the AD converter at an output thereof;
an amplifier capacitor connected between the output of the operational amplifier and an inverting input terminal of the operational amplifier; and
an amplifier switch element connected between the output of the operational amplifier and the inverting input terminal of the operational amplifier in parallel with the amplifier capacitor, turning on and off of the amplifier switch element being controlled to be in synchronization with the first output controlling switch element,
wherein the AD converter analog-to-digital converts an output signal of the operational amplifier and outputs the resulting digital signal.

16. A battery monitoring system that monitors voltages of n (n≥2) secondary batteries connected in series with each other, comprising:

a battery monitoring circuit that monitors voltages of a first secondary battery and a second secondary battery connected in series with the first secondary battery; and a microcomputer that controls the battery monitoring circuit based on measured voltages of the first and second secondary batteries, wherein the battery monitoring circuit comprising:

a first switch element connected to a first terminal at a first end, the first terminal being intended to be connected to a positive pole of a first secondary battery;

a second switch element connected to a second terminal at a first end and to a second end of the first switch element at a second end, the second terminal being intended to be connected to a negative pole of the first secondary battery and a positive pole of a second secondary battery;

a (n+1)-th switch element connected to a (n+1)-th terminal at a first end and to the second end of the first switch element at a second end, the (n+1)-th terminal being connected to a ground and intended to be connected to a negative pole of a n-th secondary battery;

a first output capacitor connected to the second end of the first switch element at a first end;

a first output controlling switch element connected between a second end of the first output capacitor and the ground;

an AD converter that analog-to-digital converts a signal responsive to a voltage at an output terminal between the second end of the first output capacitor and the first output controlling switch element and outputs the resulting digital signal; and a controlling circuit that controls turning on and off of the first to (n+1)-th switch elements and the first output controlling switch element and controls operation of the AD converter.

17. The battery monitoring system according to claim 16, wherein in a case of measuring a voltage of the first secondary battery, the controlling circuit turns on the second switch element and the first output controlling switch element and turns off the first switch element and the (n+1)-th switch element, then turns off the first to (n+1)-th switch elements and the first output controlling switch element, and then turns on the first switch element.

18. The battery monitoring system according to claim 16, wherein in a case of measuring a voltage of the second secondary battery, the controlling circuit turns on the (n+1)-th switch element and the first output controlling switch element and turns off the first switch element and the second switch element, then turns off the first to (n+1)-th switch elements and the first output controlling switch element, and then turns on the second switch element.

19. The battery monitoring system according to claim 17, wherein in a case of measuring a voltage of the second secondary battery, the controlling circuit turns on the (n+1)-th switch element and the first output controlling switch element and turns off the first switch element and the second switch element, then turns off the first to (n+1)-th switch elements and the first output controlling switch element, and then turns on the second switch element.

20. The battery monitoring system according to claim 16, wherein the battery monitoring circuit further comprising:

a second output capacitor connected between the first end of the first output capacitor and the second end of the first switch element; and a second output controlling switch element connected between a second end of the first output capacitor and a reference potential.

* * * * *